(12) United States Patent
Kim et al.

(10) Patent No.: US 9,337,031 B2
(45) Date of Patent: May 10, 2016

(54) SEMICONDUCTOR DEVICES AND METHODS OF MANUFACTURING THE SAME

(71) Applicant: SAMSUNG ELECTRONICS CO., LTD., Suwon-si, Gyeonggi-do (KR)

(72) Inventors: Dong-Hyuk Kim, Seongnam-si (KR); Geo-Myung Shin, Seoul (KR); Dong-Suk Shin, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/516,603

(22) Filed: Oct. 17, 2014

(65) Prior Publication Data

US 2015/0214051 A1 Jul. 30, 2015

(30) Foreign Application Priority Data

Jan. 28, 2014 (KR) ........................ 10-2014-0010416

(51) Int. Cl.
*H01L 21/8234* (2006.01)
*H01L 21/02* (2006.01)
*H01L 29/66* (2006.01)
*H01L 29/78* (2006.01)
*H01L 29/08* (2006.01)
*H01L 29/165* (2006.01)

(52) U.S. Cl.
CPC ...... *H01L 21/02636* (2013.01); *H01L 21/0245* (2013.01); *H01L 21/0262* (2013.01); *H01L 21/02494* (2013.01); *H01L 21/02505* (2013.01); *H01L 21/02532* (2013.01); *H01L 21/02579* (2013.01); *H01L 21/02587* (2013.01); *H01L 21/02609* (2013.01); *H01L 21/02639* (2013.01); *H01L 21/823431* (2013.01); *H01L 29/0847* (2013.01); *H01L 29/165* (2013.01); *H01L 29/66795* (2013.01); *H01L 29/7848* (2013.01); *H01L 29/7851* (2013.01); *H01L 29/66545* (2013.01)

(58) Field of Classification Search
CPC .................... H01L 21/02365; H01L 21/02518
See application file for complete search history.

(56) References Cited

U.S. PATENT DOCUMENTS

| | | | |
|---|---|---|---|
| 7,384,838 B2 | 6/2008 | Hsu et al. | |
| 7,915,693 B2 | 3/2011 | Okano | |
| 8,263,451 B2 | 9/2012 | Su et al. | |
| 8,264,021 B2 | 9/2012 | Lai et al. | |
| 8,362,574 B2 | 1/2013 | Kawasaki et al. | |
| 8,362,575 B2 | 1/2013 | Kwok et al. | |
| 8,441,072 B2 | 5/2013 | Tsai et al. | |
| 8,492,219 B2 | 7/2013 | Saitoh et al. | |
| 2011/0147828 A1 | 6/2011 | Murthy et al. | |
| 2012/0138886 A1 | 6/2012 | Kuhn et al. | |
| 2013/0049068 A1 | 2/2013 | Lin et al. | |
| 2013/0187206 A1 | 7/2013 | Mor et al. | |
| 2013/0193446 A1 | 8/2013 | Chao et al. | |

*Primary Examiner* — Cheung Lee
(74) *Attorney, Agent, or Firm* — Lee & Morse, P.C.

(57) ABSTRACT

A method of manufacturing a semiconductor device includes partially removing an upper portion of an active fin of a substrate loaded in a chamber to form a trench; and forming a source/drain layer in the trench, which includes providing a silicon source gas, a germanium source gas, an etching gas and a carrier gas into the chamber to perform a selective epitaxial growth (SEG) process using a top surface of the active fin exposed by the trench as a seed so that a silicon-germanium layer is grown; and purging the chamber by providing the carrier gas into the chamber to etch the silicon-germanium layer.

9 Claims, 20 Drawing Sheets

B — B'

SECOND
DIRECTION
⊗ → FIRST DIRECTION

C — C'

SECOND
DIRECTION
⊗ → FIRST DIRECTION

FIRST DIRECTION
SECOND DIRECTION

SECOND DIRECTION
FIRST DIRECTION

SEMICONDUCTOR DEVICES AND METHODS OF MANUFACTURING THE SAME

CROSS-REFERENCE TO RELATED APPLICATION

Korean Patent Application No. 10-2014-0010416 filed on Jan. 28, 2014, in the Korean Intellectual Property Office, and entitled: "Semiconductor Devices and Methods of Manufacturing The Same," is incorporated by reference herein in its entirety.

BACKGROUND

1. Field

Example embodiments relate to semiconductor devices and methods of manufacturing the same, for example, fin-type field effect transistors (finFETs) and methods of manufacturing the same.

2. Description of the Related Art

A fin field-effect transistor (finFET) is a three-dimensional (3D) transistor having a fin structure protruding from a substrate.

SUMMARY

Embodiments may be realized by providing a method of manufacturing a semiconductor device, the method including partially removing an upper portion of an active fin of a substrate loaded in a chamber to form a trench; and forming a source/drain layer in the trench, including providing a silicon source gas, a germanium source gas, an etching gas and a carrier gas into the chamber to perform a selective epitaxial growth (SEG) process using a top surface of the active fin exposed by the trench as a seed so that a silicon-germanium layer is grown; and purging the chamber by providing the carrier gas into the chamber to etch the silicon-germanium layer.

The silicon source gas may include dichlorosilane ($SiH_2Cl_2$) gas, the germanium source gas may include germane ($GeH_4$) gas, the etching gas may include hydrogen chloride (HCl) gas, and the carrier gas may include hydrogen ($H_2$) gas.

A ratio of the etching gas with respect to the germane source gas remaining in the chamber during at least an initial period of etching the silicon-germanium layer may be higher than that during growing the silicon-germanium layer.

Growing the silicon-germanium layer may be performed by providing diborane ($B_2H_6$) gas serving as a p-type impurity source gas into the chamber in addition to the silicon source gas, the germanium source gas, the etching gas and the carrier gas.

Forming the source/drain layer may include forming a first silicon-germanium layer; forming a second silicon-germanium layer on the first silicon-germanium layer, the second silicon-germanium layer having higher contents of germanium and boron than the first silicon-germanium layer; and forming a silicon layer on the second silicon-germanium layer. Forming the second silicon-germanium layer may include growing the second silicon-germanium layer and etching the second silicon-germanium layer.

Growing the silicon-germanium layer and etching the silicon-germanium layer may each be performed a plurality of times.

The trench may be filled with the silicon-germanium layer after growing the silicon-germanium layer a plurality of times.

Etching the silicon-germanium layer may be performed at a temperature higher than that of growing the silicon-germanium layer.

The method may further include forming a plurality of dummy gate structures on the active fin prior to forming the trench. The trench may be formed by removing an upper portion of the active fin not covered by the dummy gate structures.

Embodiments may be realized by providing a semiconductor device, including a substrate having an active fin extending in a second direction; a plurality of gate structures on the active fin, each of the gate structures extending in a first direction substantially perpendicular to the first direction; and a source/drain layer filling a trench on the active fin between the gate structures and having a cross-section cut along the first direction in a shape of a pentagon or hexagon, the cross-section including a band therein having a shape of a portion of an elliptical ring or a portion of a circular ring.

The source/drain layer may have a flat top surface in the second direction.

The source/drain layer may include a first silicon-germanium layer; a second silicon-germanium layer on the first silicon-germanium layer, the second silicon-germanium layer having higher contents of germanium and boron than the first silicon-germanium layer; and a silicon layer on the second silicon-germanium layer.

The second silicon-germanium layer may have a cross-section cut along the first direction including a band therein having a shape of a portion of an elliptical ring or a portion of a circular ring.

The band may be a silicon-germanium layer having a higher content of silicon than portions of the second silicon-germanium layer adjacent thereto.

The semiconductor device may further comprise a spacer covering a lower sidewall of the source/drain layer and an upper sidewall of the active fin.

Embodiments may be realized by providing a method of manufacturing a semiconductor device, the method including partially removing an upper portion of an active fin of a substrate loaded in a chamber to form a trench, the active fin extending in a second direction; and forming a source/drain layer in the trench, including forming a first silicon-germanium layer; forming a second silicon-germanium layer on the first silicon-germanium layer; and etching the second silicon-germanium layer to form a second silicon-germanium layer pattern, an upper cross-section of the second silicon-germanium layer pattern cut along the second direction having a concave shape rounder than that of the second silicon-germanium layer.

The upper cross-section cut along the second direction of the second silicon-germanium layer pattern may not have a V-like shape.

The upper cross-section cut along the second direction of the second silicon-germanium layer may have a V-like shape.

Forming the source/drain layer in the trench may include providing a silicon source gas, a germanium source gas, an etching gas and a carrier gas into the chamber to perform a selective epitaxial growth (SEG) process; and purging the chamber by providing the carrier gas into the chamber. Etching gas may remain in the chamber after purging.

Forming the source/drain layer in the trench may further include forming a third silicon-germanium layer on the second silicon-germanium layer; and etching the third silicon-germanium layer to form a third silicon-germanium layer pattern, an upper cross-section cut along the second direction of the third silicon-germanium layer pattern having a concave shape rounder than that of the third silicon-germanium layer.

BRIEF DESCRIPTION OF THE DRAWINGS

Features will become apparent to those of skill in the art by describing in detail exemplary embodiments with reference to the attached drawings in which:

FIGS. 1, 3, 7, 10, 21, 24 and 28 illustrate plan views, and FIGS. 2, 4-6, 8-9, 11-20, 22-23, 25-27 and 29-31 illustrate cross-sectional views.

DETAILED DESCRIPTION

Figure 1:
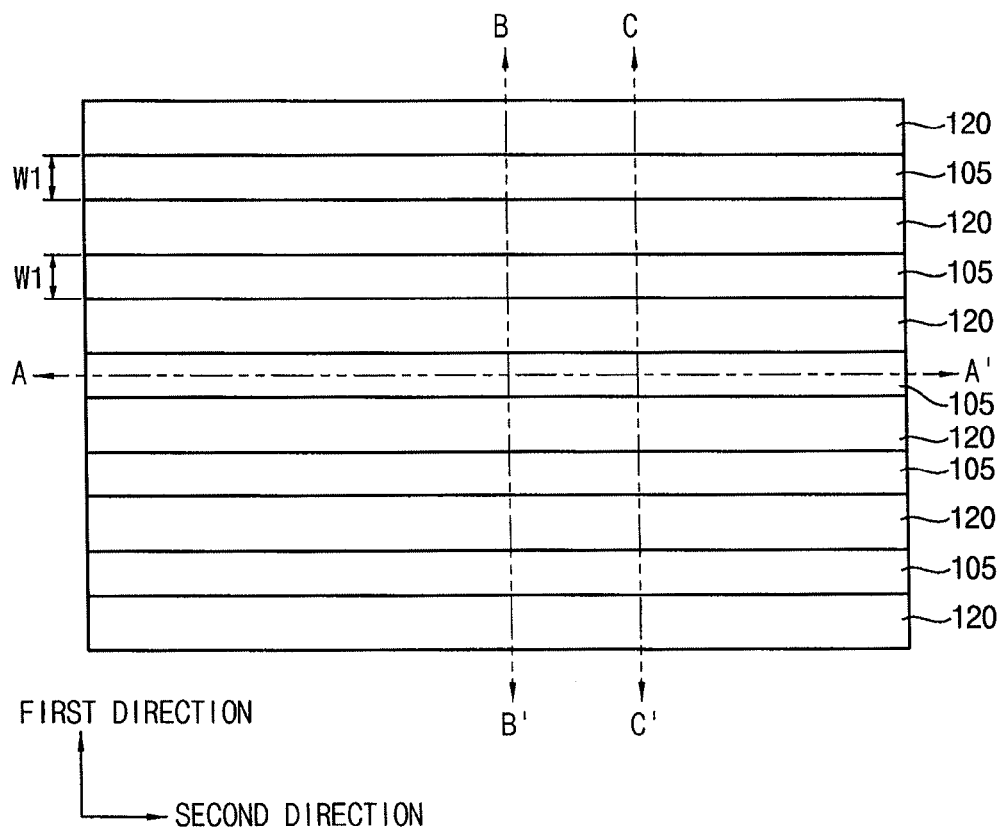
FIGS. 1 to 31 illustrate cross-sectional views of stages of a method of manufacturing a semiconductor device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may not illustrate the actual shape of a region of a device and are not intended to be limiting.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 31 illustrate cross-sectional views of stages of a method of manufacturing a semiconductor device in accordance with example embodiments. FIGS. 1, 3, 7, 10, 21, 24 and 28 are plan views, and FIGS. 2, 4-6, 8-9, 11-20, 22-23, 25-27 and 29-31 illustrate cross-sectional views.

Figure 6:
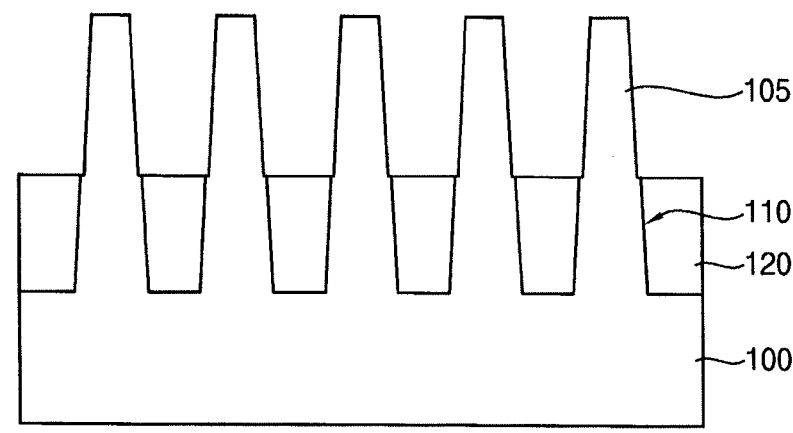
Figure 8:
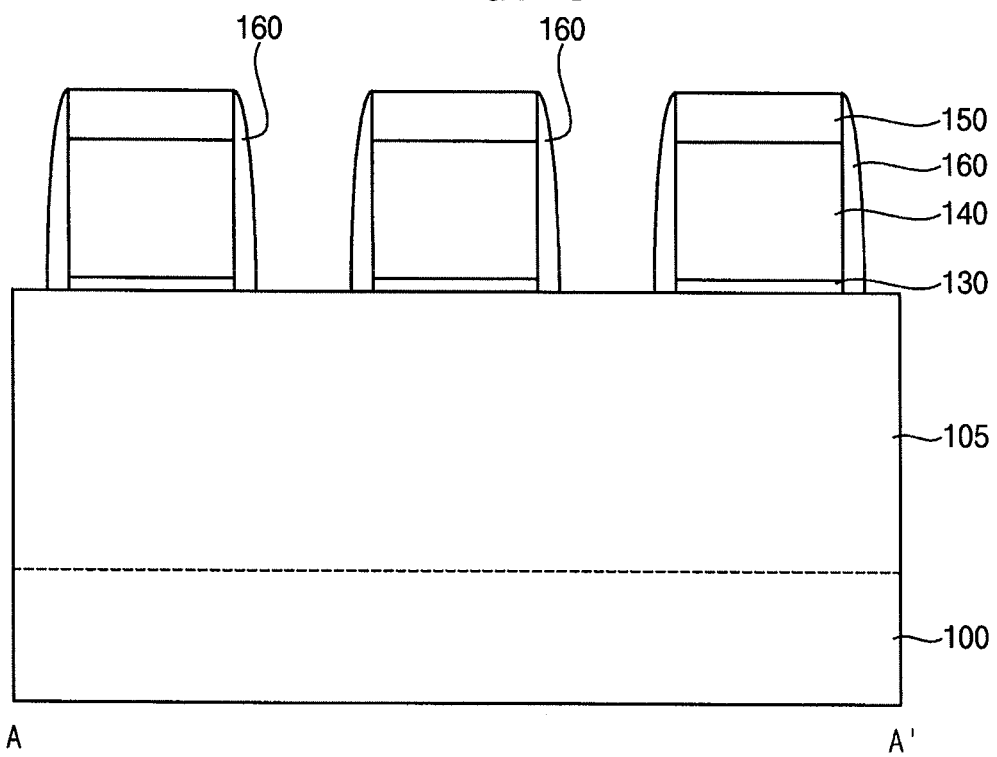
Figure 9:
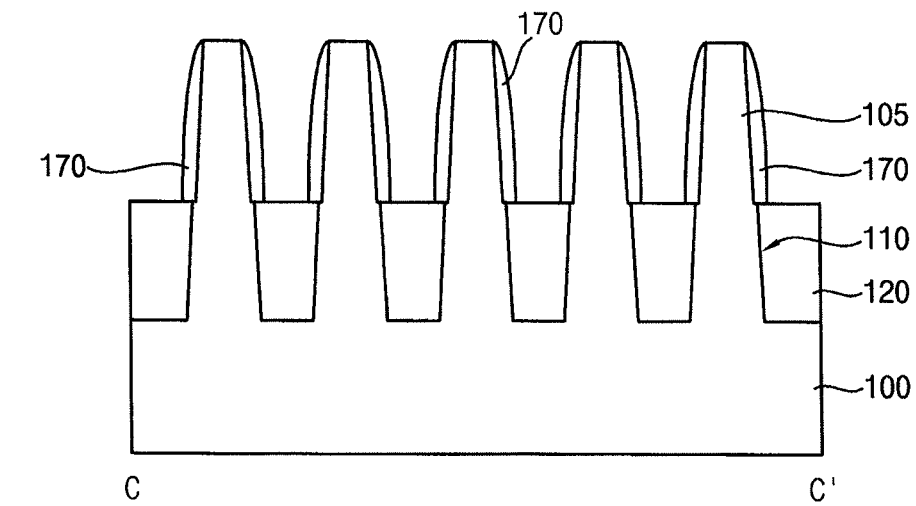

FIGS. 4, 8, 11, 13, 15, 17, 19, 22, 25 and 29 illustrate cross-sectional views cut along a line A-A' of corresponding plan views, FIGS. 2, 5, 26 and 30 are cross-sectional views cut along a line B-B' of corresponding plan views, and FIGS. 6, 9,

12, 14, 16, 18, 20, 23, 27 and 31 illustrate cross-sectional views cut along a line C-C' of corresponding plan views.

Figure 2:
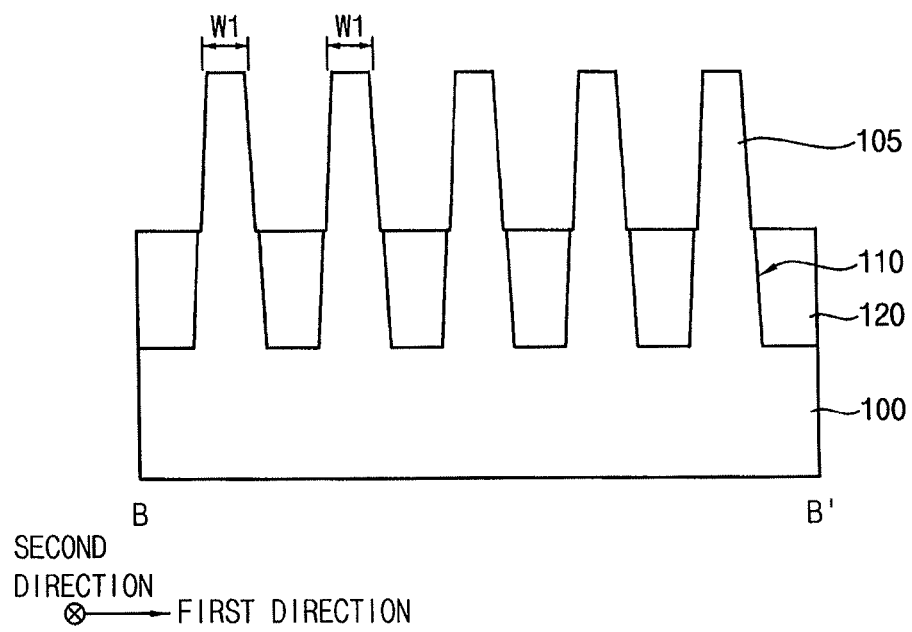
Figure 3:
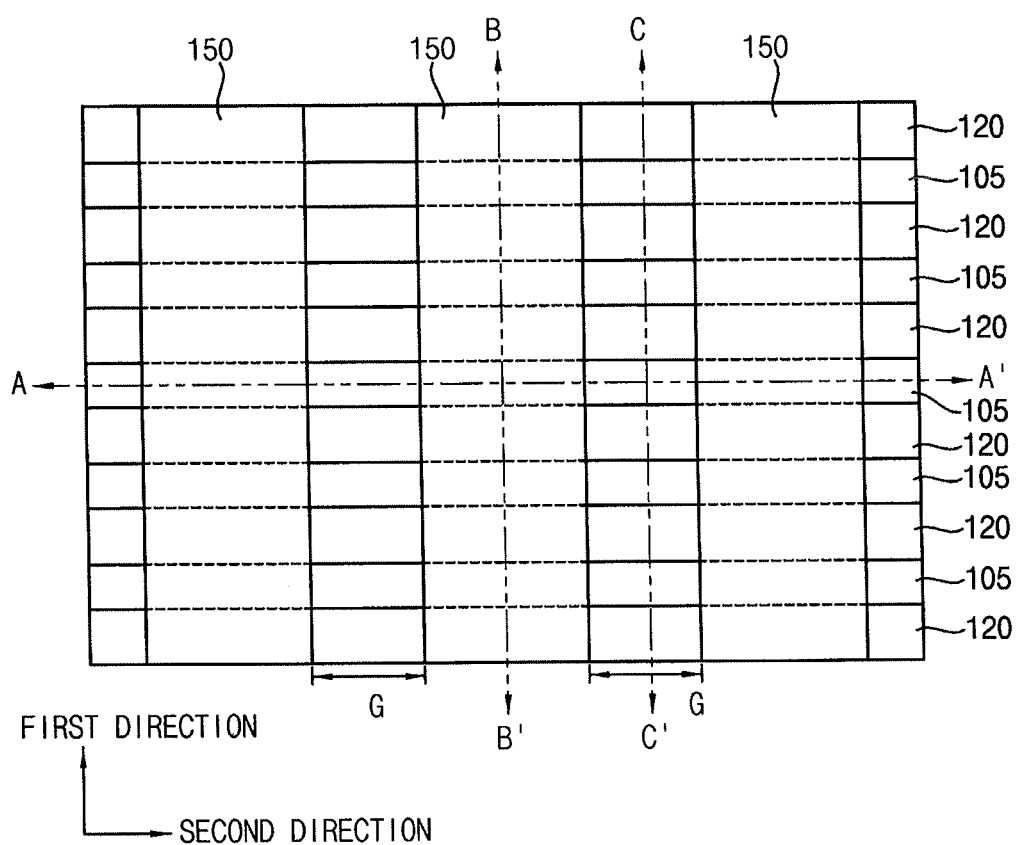
Figure 4:
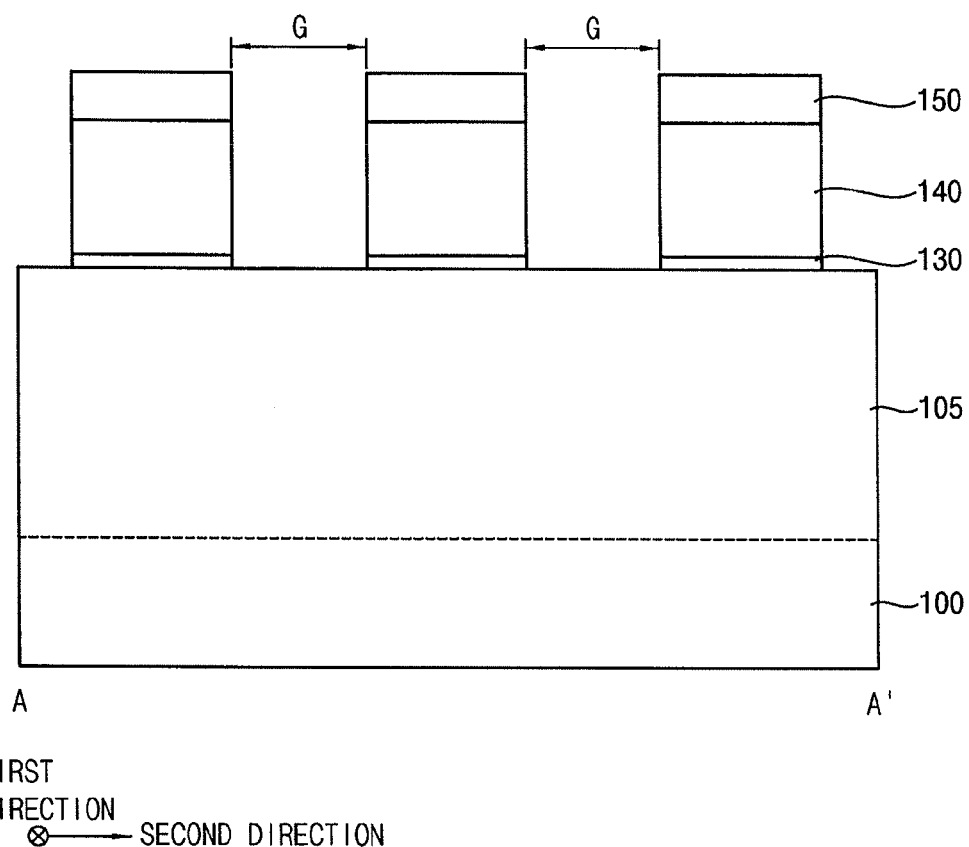
Figure 5:
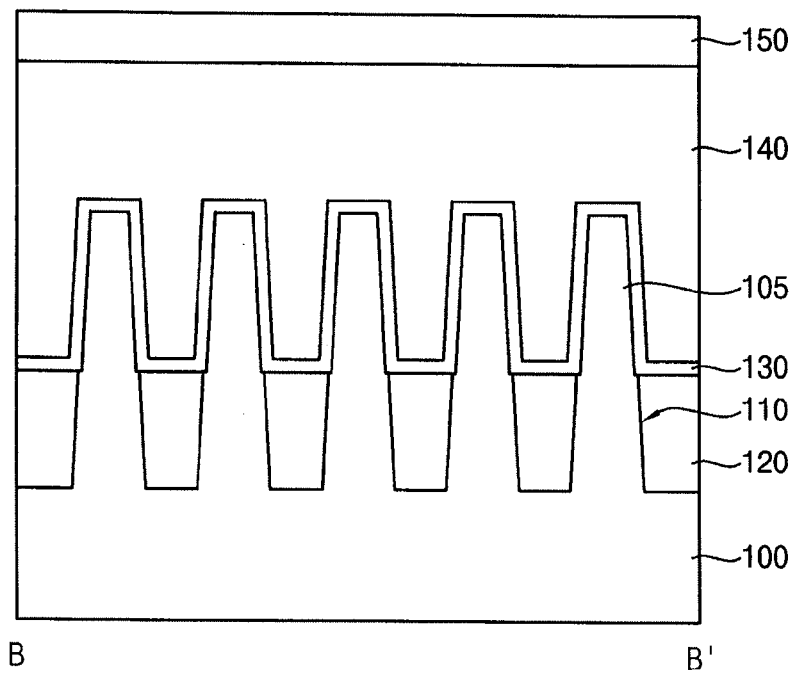

Referring to FIGS. 1 and 2, a substrate 100 may be partially removed to form a first trench 110, and an isolation layer 120 may be formed on the substrate 100 to fill the first trench 110.

The substrate 100 may be, for example, a silicon substrate, a germanium substrate, a silicon-germanium substrate, a silicon-on-insulator (SOI) substrate, or a germanium-on-insulator (GOI) substrate.

In example embodiments, the isolation layer 120 may be formed by forming an insulation layer on the substrate 100 to sufficiently fill the first trench 110, planarizing the insulation layer until a top surface of the substrate 100 is exposed, and removing an upper portion of the planarized insulation layer to expose an upper portion of the first trench 110. When the upper portion of the planarized insulation layer is removed, an upper portion of the substrate 100 may be partially removed also. The insulation layer may be formed to include an oxide, e.g., silicon oxide.

As the isolation layer 120 is formed, a field region, a top surface of which may be covered by the isolation layer 120, and an active region, a top surface of which may not be covered by the isolation layer 120, may be defined in the substrate 100. The active region may protrude from the isolation layer 120 and have a fin shape, and may be referred to as an active fin 105.

In example embodiments, the active fin 105 may extend in a second direction, substantially parallel to the top surface of the substrate 100, and a plurality of active fins 105 may be formed in a first direction, substantially parallel to the top surface of the substrate 100 and substantially perpendicular to the second direction. The active fin 105 may have a first width W1 in the first direction.

Referring to FIGS. 3 to 6, a plurality of dummy gate structures may be formed on the substrate 100.

The dummy gate structures may be formed by sequentially stacking a gate insulation layer, and a dummy gate electrode layer and a gate mask layer on the active fin 105 of the substrate 100 and the isolation layer 120, patterning the gate mask layer by a photolithography process using a photoresist pattern (not shown) to form a gate mask 150, and sequentially etching the dummy gate electrode layer and the gate insulation layer using the gate mask 150 as an etching mask. Each of the dummy gate structures may be formed to include a gate insulation layer pattern 130, a dummy gate electrode 140 and a gate mask 150 sequentially stacked on the active fin 105 of the substrate 100 and a portion of the isolation layer 120 adjacent to the active fin 105 in the first direction.

The gate insulation layer may be formed to include an oxide, e.g., silicon oxide, the dummy gate electrode layer may be formed to include, e.g., polysilicon, and the gate mask layer may be formed to include a nitride, e.g., silicon nitride. The gate insulation layer may be formed by, for example, a chemical vapor deposition (CVD) process, or an atomic layer deposition (ALD) process. In an embodiment, the gate insulation layer may be formed by a thermal oxidation process on an upper portion of the substrate 100. The dummy gate electrode layer and the gate mask layer may be also formed by, for example, a CVD process or an ALD process.

In example embodiments, each of the dummy gate structures may be formed to extend in the first direction on the active fins 105 of the substrate 100 and the isolation layer 120, and the plurality of dummy gate structures may be formed to be spaced apart from each other by a gap G in the second direction.

An impurity region (not shown) may be formed at upper portions of the active fin 105 adjacent to the dummy gate structures by an ion implantation process.

Figure 7:
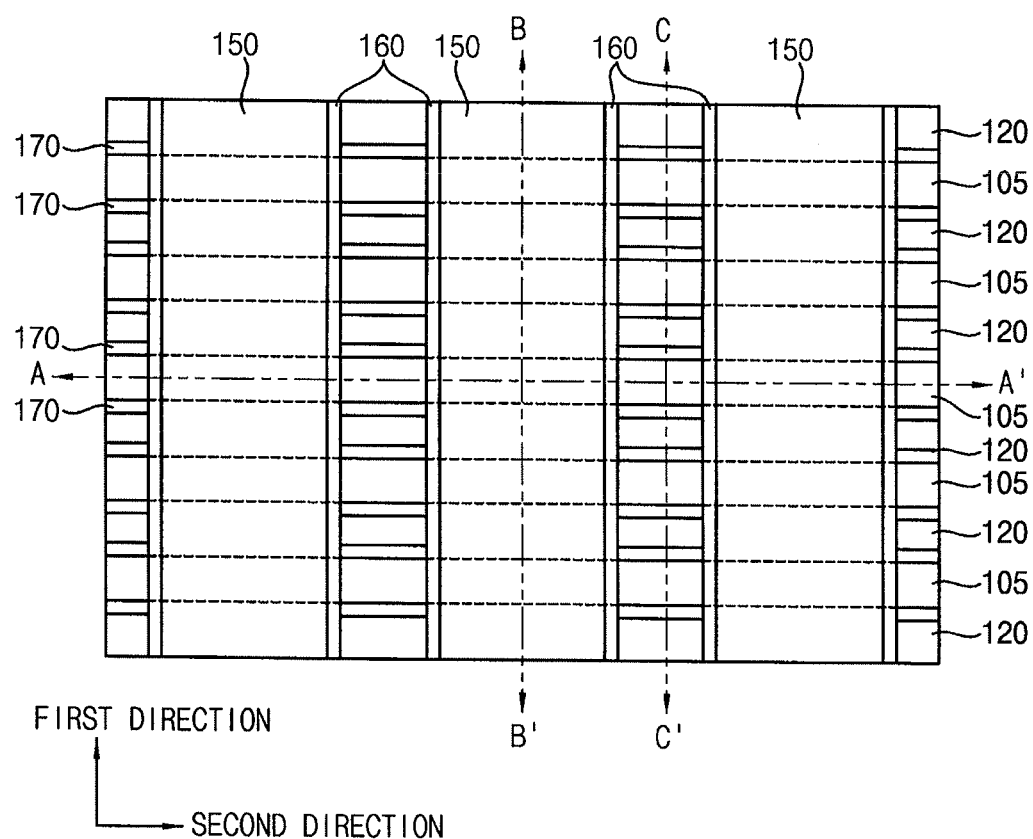

Referring to FIGS. 7 to 9, a gate spacer 160 and a spacer 170 may be formed on sidewalls of the dummy gate structures and the active fin 105, respectively.

In example embodiments, the gate spacer 160 and the spacer 170 may be formed by forming a spacer layer on the dummy gate structures, the active fin 105 and the isolation layer 120, and anisotropically etching the spacer layer. The spacer layer may be formed to include a nitride, e.g., silicon nitride or silicon oxycarbonitride.

In example embodiments, the gate spacer 160 may be formed on both sidewalls of each of the dummy gate structures in the second direction, and the spacer 170 may be formed on both sidewalls of the active fin 105 in the first direction.

Figure 10:
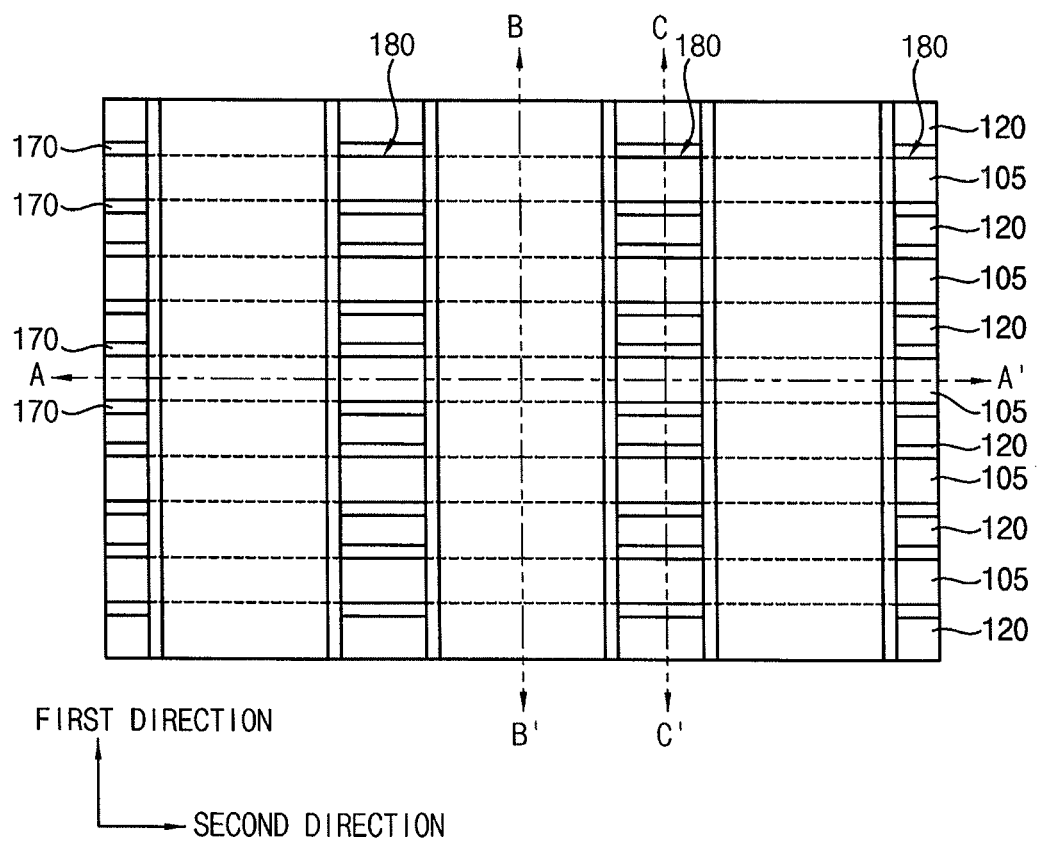
Figure 11:
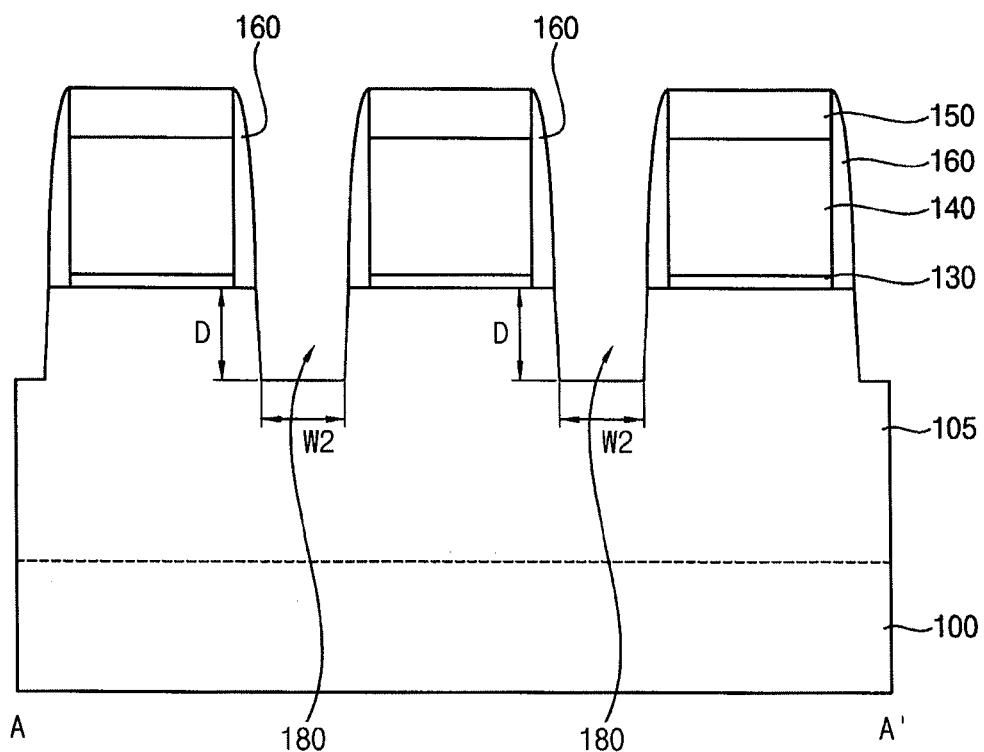
Figure 12:
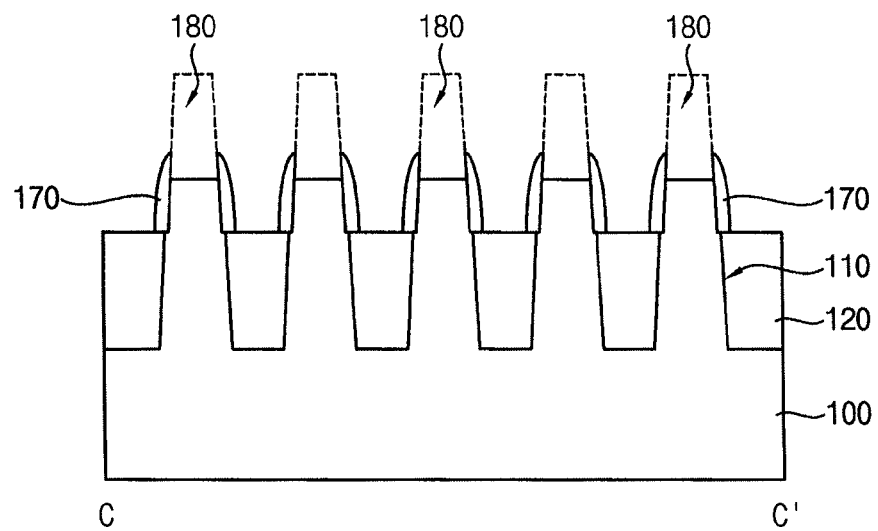

Referring to FIGS. 10 to 12, an upper portion of the active fin 105 of the substrate 100 may be removed using the dummy gate structures and the gate spacer 160 as an etching mask to form a second trench 180.

An upper portion of the spacer 170 may be also removed during the etching process, and a top surface of the spacer 170 may become lower than a top surface of the initial active fin 105; sidewalls of the second trench 180 in the first direction may be defined by inner sidewalls of the initial spacer 170 before the etching process, as shown in FIG. 12. The second trench 180 may have a depth D toward an inside of the substrate 100, and have a second width W2 in the second direction.

The etching process for forming the second trench 180 may be performed in-situ with the anisotropical etching process for the spacer layer illustrated with reference to FIGS. 7 to 9.

Figure 13:
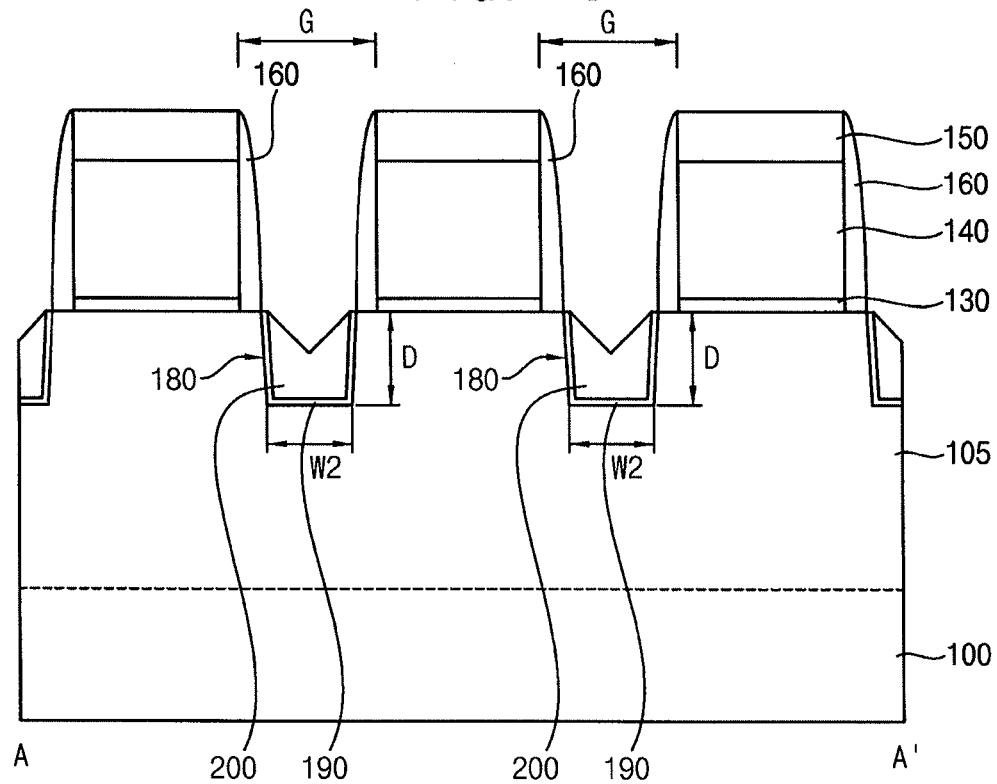
Figure 14:
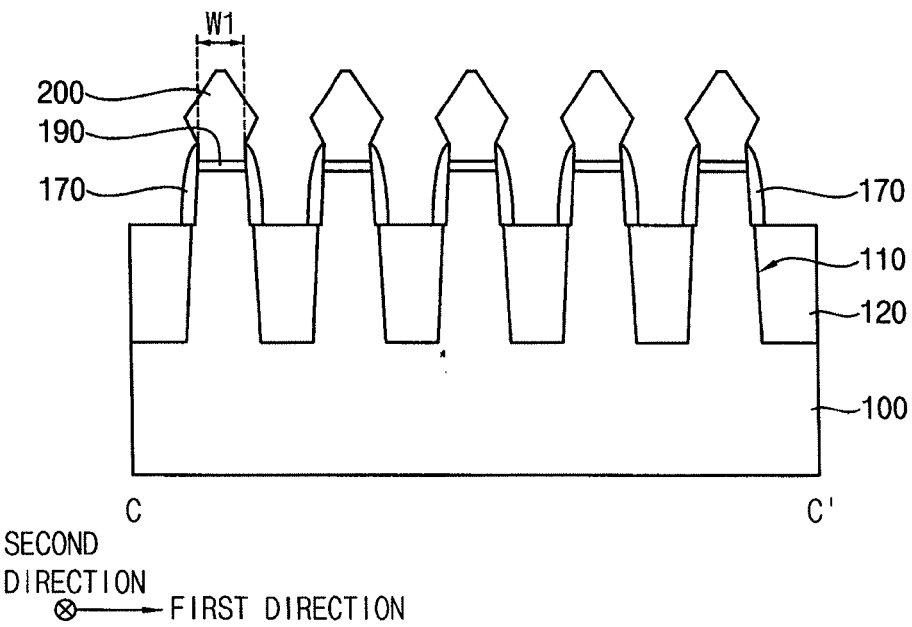

Referring to FIGS. 13 and 14, first and second silicon-germanium layers 190 and 200 may be sequentially formed on the active fin 105 to partially fill the second trench 180.

In example embodiments, the first silicon-germanium layer 190 may be formed by loading the substrate 100 having the resultant structures thereon into a process chamber (not shown), and providing a silicon source gas, a germanium source gas, an etching source gas and a carrier gas into the chamber to perform a first selective epitaxial growth (SEG) process using the active fin 105 exposed by the second trench 180 as a seed. Further, the second silicon-germanium layer 200 may be formed by providing the silicon source gas, the germanium source gas, the etching source gas and the carrier gas into the chamber to perform a second selective epitaxial growth (SEG) process using the first silicon-germanium layer 190 as a seed.

The first and second SEG processes may be performed using, e.g., dichlorosilane ($SiH_2Cl_2$) gas as the silicon source gas, germane ($GeH_4$) gas as the germanium source gas, hydrogen chloride (HCl) gas as the etching gas, and hydrogen ($H_2$) gas as the carrier gas, and single crystalline first and second silicon-germanium layers 190 and 200 may be formed. In example embodiments, a p-type impurity source gas, e.g., diborane ($B_2H_6$) gas, may be also used to form the single crystalline silicon-germanium layers 190 and 200 doped with p-type impurities.

In example embodiments, flow rates of the above gases used in the first and second SEG processes may be controlled, and the first silicon-germanium layer 190 may have contents of germanium and boron lower than those of the second silicon-germanium layer 200. The substrate 100 may be a silicon substrate, the first silicon-germanium layer 190 may reduce the lattice mismatch between the active fin 105 and the second silicon-germanium layer 200, and may serve as a buffer layer between the silicon substrate 100 and the second silicon-germanium layer 200 having the relatively high contents of germanium and boron.

In example embodiments, the first silicon-germanium layer 190 may be conformally formed on a bottom surface and both sidewalls in the second direction of the second trench 180. A top surface of a portion of the first silicon-germanium layer 190 on the bottom surface of the second trench 180 may be lower than the top surface of the spacers 170 on both sidewalls of the active fin 105 in the first direction. The portion of the first silicon-germanium layer 190 on the bottom surface of the second trench 180 may grow within a restricted area by the spacers 170 so as to be formed only in a lower portion of the second trench 180.

In an embodiment, the top surface of the portion of the first silicon-germanium layer 190 on the bottom surface of the second trench 180 may be formed to be higher than the top surface of the spacer 170, and the first silicon-germanium layer 190 may protrude from the spacers 170 on both sidewalls of the active fin 105 in the first direction. The horizontal growth of an upper portion of the first silicon-germanium layer 190 in the first direction may not be restricted by the spacers 170 as the second silicon-germanium layer 200 is subsequently formed, and the upper portion of the first silicon-germanium layer 190 may be formed to have a shape similar to that of the second silicon-germanium layer 200.

The second silicon-germanium layer 200 may be formed on the first silicon-germanium layer 190 to partially fill the second trench 180, and may protrude from the spacers 170. The second silicon-germanium layer 200 may be formed only in the restricted area defined by the first silicon-germanium layer 190 and the inner walls of the spacers 170 under the top surface of the spacers 170. The second silicon-germanium layer 200 may grow both in the vertical and horizontal directions above the top surface of the spacers 170. The substrate 100 may be a (100) silicon substrate and the active fin 105 may have a <110> crystal orientation, the second silicon-germanium layer 200 may have a growth rate that is lowest in a <111> crystal orientation, and the second silicon-germanium layer 200 may be formed to have a {111} crystal plane.

The second silicon-germanium layer 200 may have a cross-section cut along the first direction in a shape of a pentagon or hexagon. The second silicon-germanium layer 200 may grow also from a portion of the first silicon-germanium layer 190 on both sidewalls of the second trench 180 in the second direction to have the {111} crystal plane, and an upper surface of a cross-section cut along the second direction of the second silicon-germanium layer 200 may have a concave shape, e.g., a V-like shape.

The first width W1 of the active fin 105 in the first direction may be too narrow, or the gap G between the dummy gate structures in the second direction may be too large and the second width W2 of the second trench 180 in the second direction may be too large, or the depth D of the second trench 180 may be too deep. In such a situation, an upper surface of a cross-section cut along the second direction of the second silicon-germanium layer 200 may have a deep V-like shape, or in some cases, no second silicon-germanium layer 200 may be formed on a central bottom surface of the second trench 180.

Figure 15:
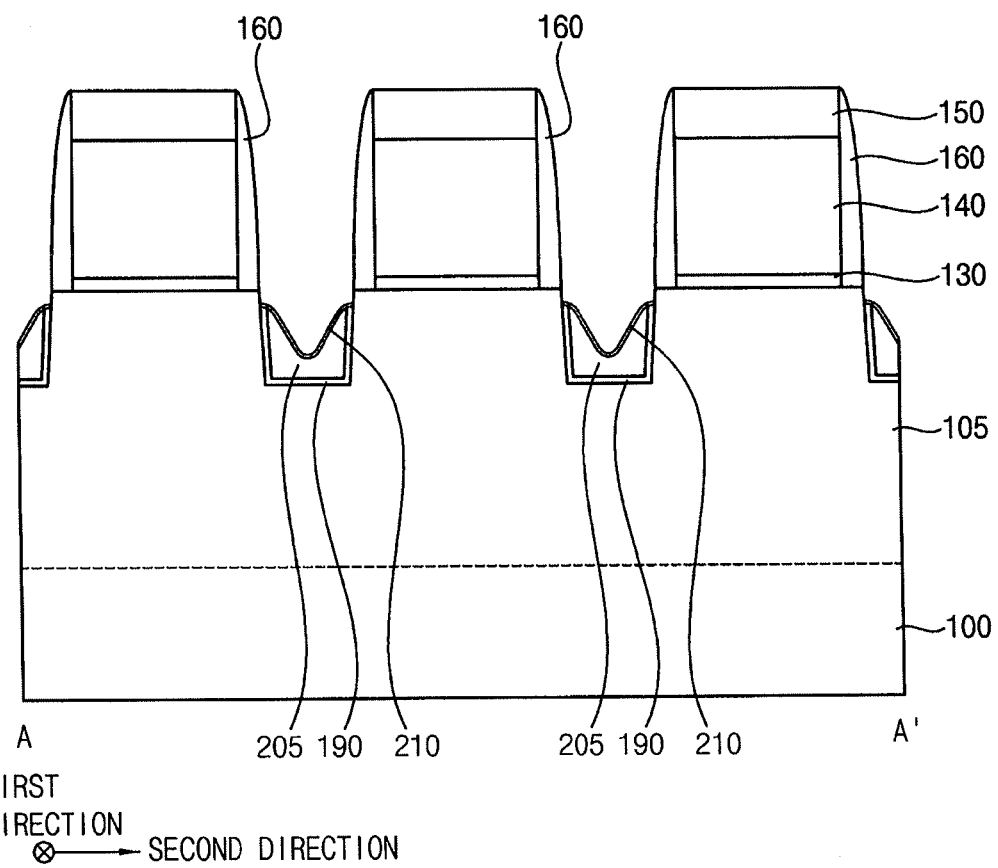
Figure 16:
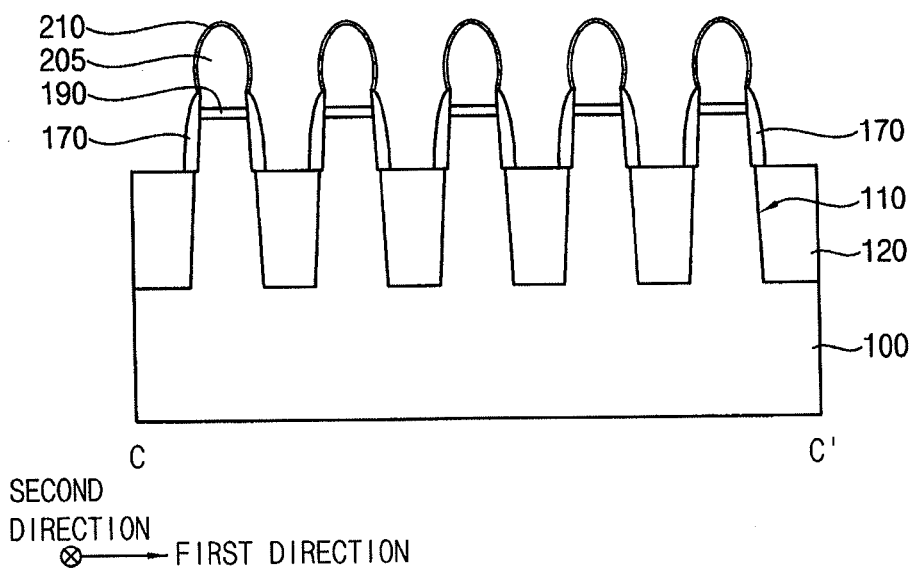

Referring to FIGS. 15 and 16, a first purge process may be performed to discharge a remaining gas in the process chamber to an outside.

In example embodiments, the first purge process may be performed by providing hydrogen ($H_2$) gas serving as the carrier gas in the first and second SEG processes into the chamber. Hydrogen ($H_2$) gas may serve as a purging gas in the first purge process.

During the first purge process, molecules having a relatively small molecular weight may be discharged to the outside more quickly than molecules having a relatively large molecular weight. Germane ($GeH_4$) gas having a relatively small molecular weight among the gases used in the first and second SEG processes may be discharged to the outside at a fast speed, and hydrogen chloride (HCl) gas or dichlorosilane ($SiH_2Cl_2$) gas having a relatively large molecular weight among the gases used in the first and second SEG processes may be discharged at a low speed.

A ratio of the hydrogen chloride (HCl) gas with respect to the germane ($GeH_4$) gas remaining in the chamber during at least an initial period in the first purge process may be higher than that during the second SEG process. The etching gas may remain more than the germanium source gas in the chamber, and the second silicon-germanium layer 200 in the chamber may be partially etched. The first purge process may serve as an etching process.

In example embodiments, the {111} crystal plane of the second silicon-germanium layer 200 may be etched in the first purge process to form a second silicon-germanium layer pattern 205. An upper cross-section cut along the first direction of the second silicon-germanium layer pattern 205 may have a shape of a portion of an ellipse or a portion of a circle. Additionally, an upper cross-section cut along the second direction of the second silicon-germanium layer pattern 205 may have a concave shape smoother, e.g., rounder, than that of the second silicon-germanium layer 200.

During the first purge process, the silicon source gas and the germanium source gas may remain a little in the chamber, and a silicon-germanium layer having a small thickness may grow. As described above, the silicon source gas may remain more than the germanium source gas in the chamber, and a first silicon-rich silicon-germanium layer 210 having a greater content of silicon and a less content of germanium than the second silicon-germanium layer 200 or the second silicon-germanium layer pattern 205 may be formed. In example embodiments, the first silicon-rich silicon-germanium layer 210 may be conformally formed on the second silicon-germanium layer pattern 205, and may have a cross-section cut along the second direction in a shape of a portion of an elliptical ring or a portion of a circular ring.

An amount of the etching of the second silicon-germanium layer 200 may be controlled by the flow rate of the hydrogen ($H_2$) gas provided in the first purge process or a temperature at which the first purge process may be performed. The flow rate of the hydrogen ($H_2$) gas provided in the first purge process may be increased or the temperature at which the first purge process is performed may be increased, and the second silicon-germanium layer 200 may be etched more. In an example embodiment, the first purge process may be performed at a temperature higher than that of the second SEG process.

Figure 17:
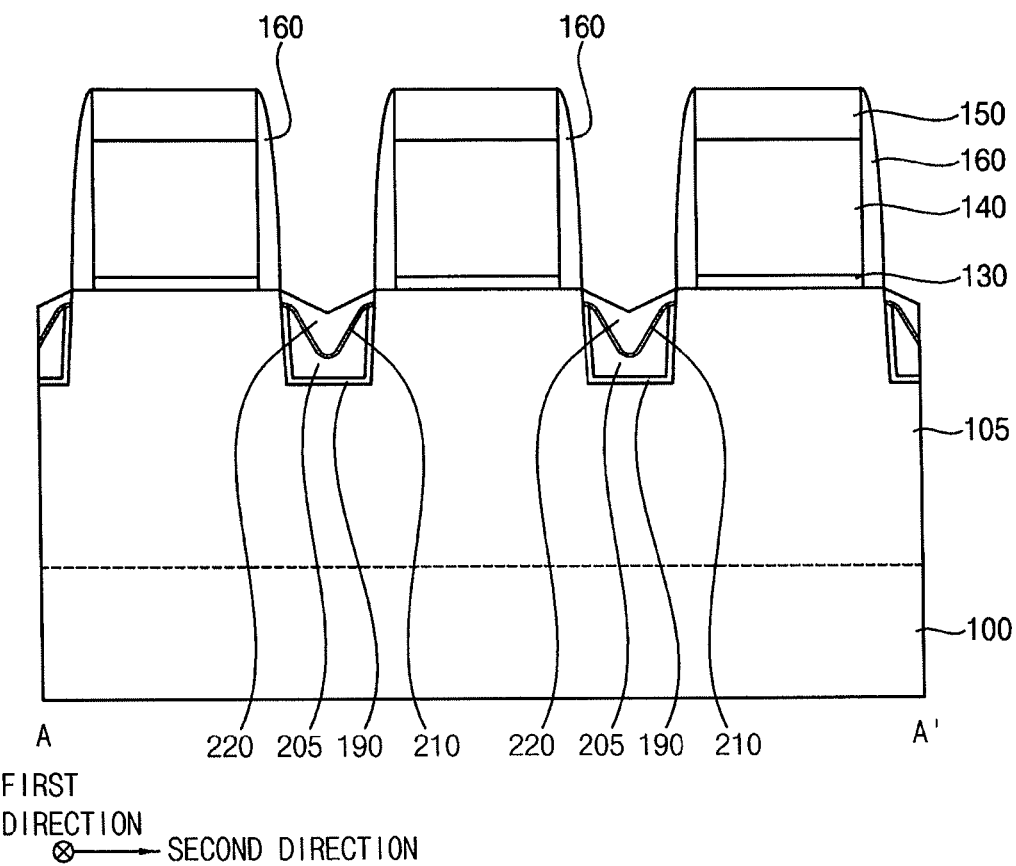
Figure 18:
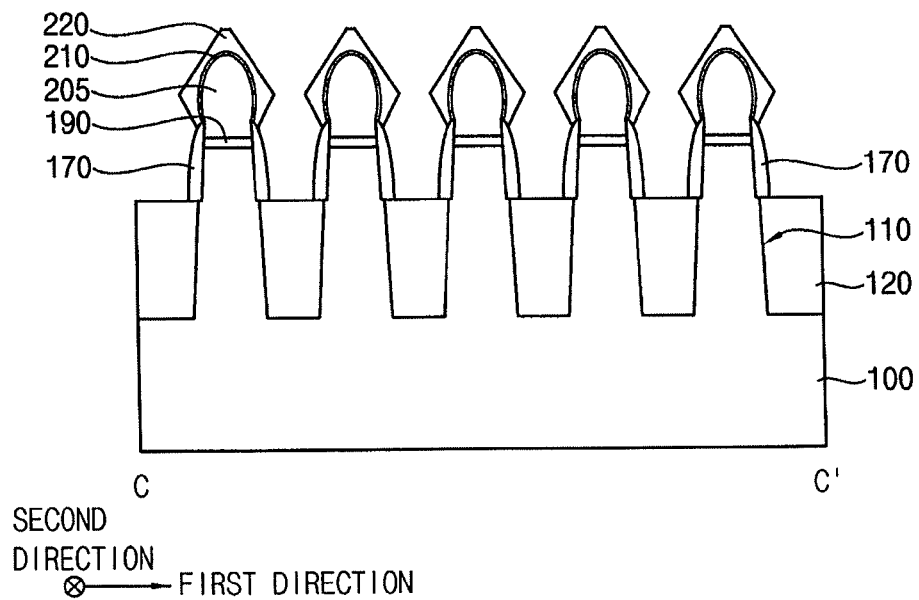

Referring to FIGS. 17 and 18, a third SEG process that may be substantially the same as or similar to the second SEG process among the processes illustrated with reference to FIGS. 13 and 14 may be performed.

A third silicon-germanium layer 220 may be formed on the first silicon-rich silicon-germanium layer 210. The third silicon-germanium layer 220 may have a cross-section cut along the first direction in a shape of a pentagon or hexagon. Additionally, an upper surface of a cross-section cut along the second direction of the third silicon-germanium layer 220 may have a concave shape, e.g., a V-like shape. A depth of the V-like shape of the third silicon-germanium layer 220 may be less than that of the second silicon-germanium layer 200.

In example embodiments, the third silicon-germanium layer 220 may be formed to have contents of silicon and germanium substantially the same as those of the second silicon-germanium layer 200. In an embodiment, flow rates of the gases used in the third SEG process may be controlled, and the third silicon-germanium layer 220 may be formed to have contents of silicon and germanium different from those of the second silicon-germanium layer 200 that may be formed by the second SEG process.

Figure 19:
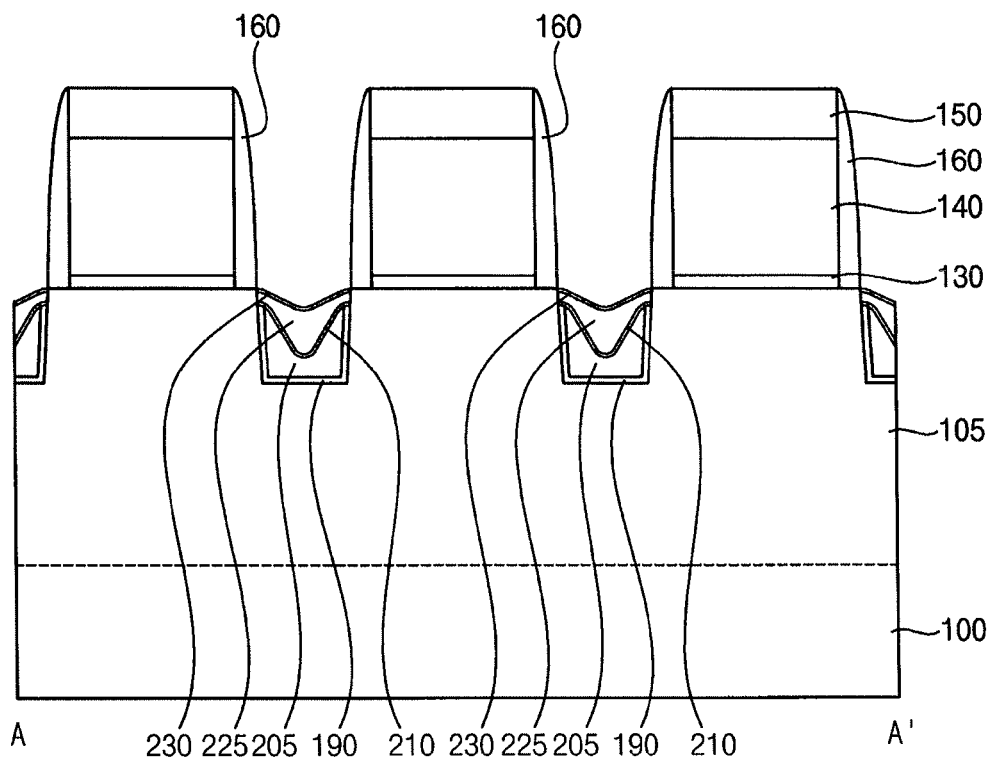
Figure 20:
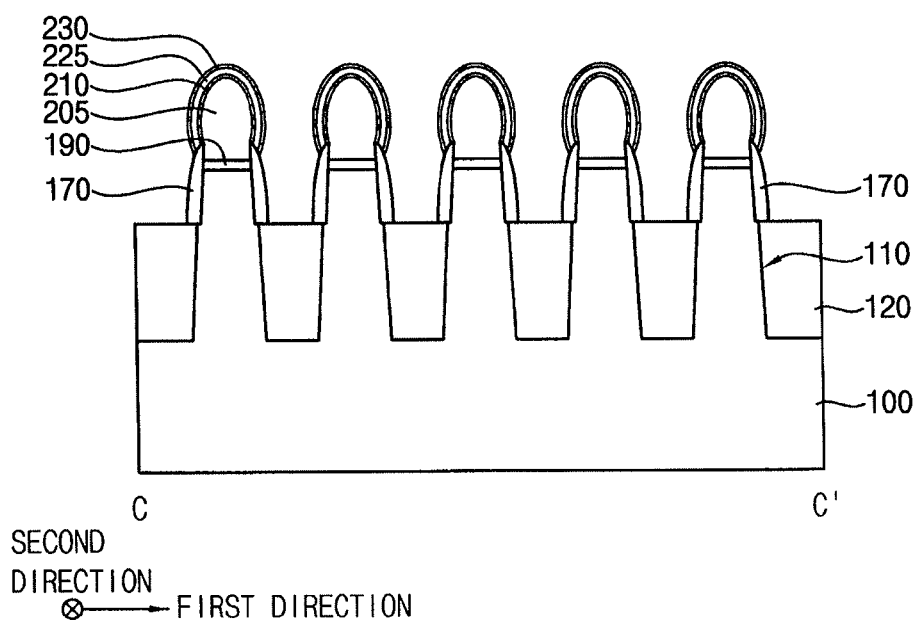

Referring to FIGS. 19 and 20, a process substantially the same as or similar to that illustrated with reference to FIGS. 15 and 16 may be performed.

Hydrogen ($H_2$) gas may be provided into the chamber to perform a second purge process, and gases remaining in the chamber may be discharged to the outside.

An upper cross-section cut along the first direction of a third silicon-germanium layer pattern 225 may have a shape of a portion of an ellipse or a portion of a circle, and an upper surface of an upper cross-section cut along the second direction of the third silicon-germanium layer pattern 225 may have a concave shape smoother, e.g., rounder, than that of the third silicon-germanium layer 220. Additionally, a second silicon-rich silicon-germanium layer 230 having a greater content of silicon and a less content of germanium than the third silicon-germanium layer 220 or the third silicon-germanium layer pattern 225 may be formed. In example embodiments, the second silicon-rich silicon-germanium layer 230 may be conformally formed on the third silicon-germanium layer pattern 225, and may have a cross-section cut along the second direction in a shape of a portion of an elliptical ring or a portion of a circular ring.

In example embodiments, the second silicon-rich silicon-germanium layer 230 may be formed to have contents of silicon and germanium substantially the same as those of the first silicon-rich silicon-germanium layer 210. In an embodiment, flow rates of the gases used in the second purge process may be controlled, and the second silicon-rich silicon-germanium layer 230 may be formed to have contents of silicon and germanium different from those of the first silicon-rich silicon-germanium layer 210 that may be formed by the first purge process.

Figure 21:
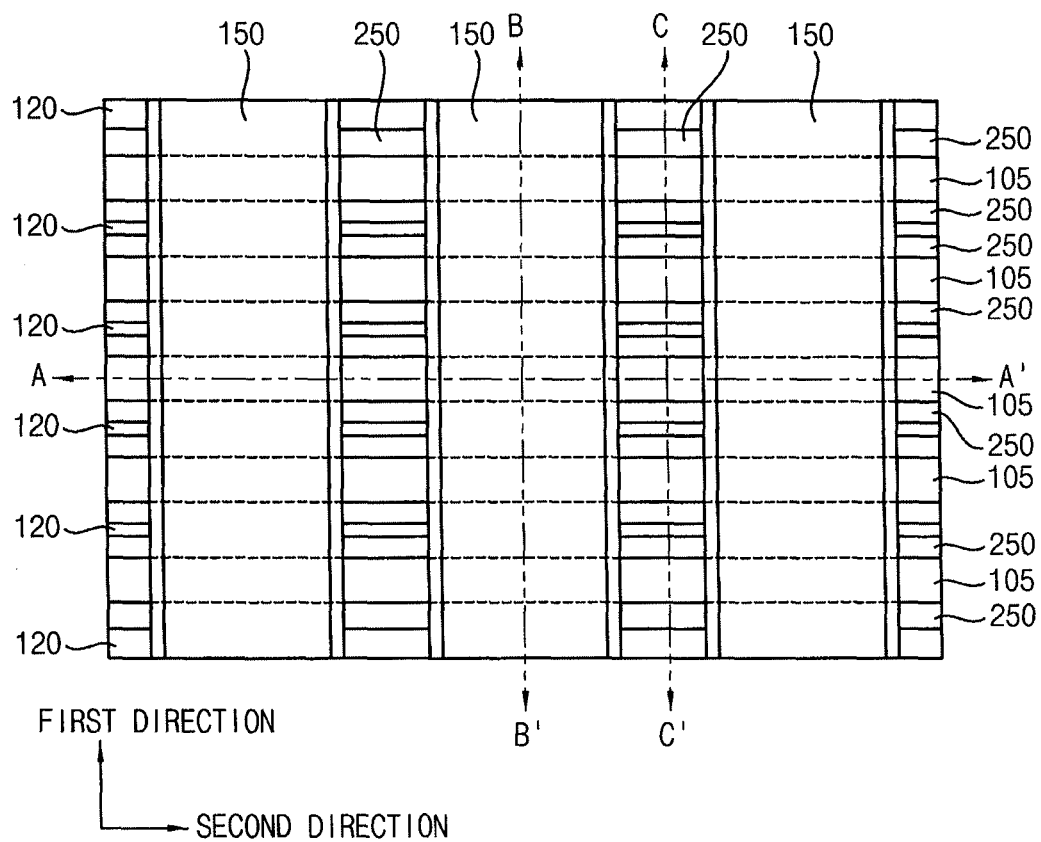
Figure 22:
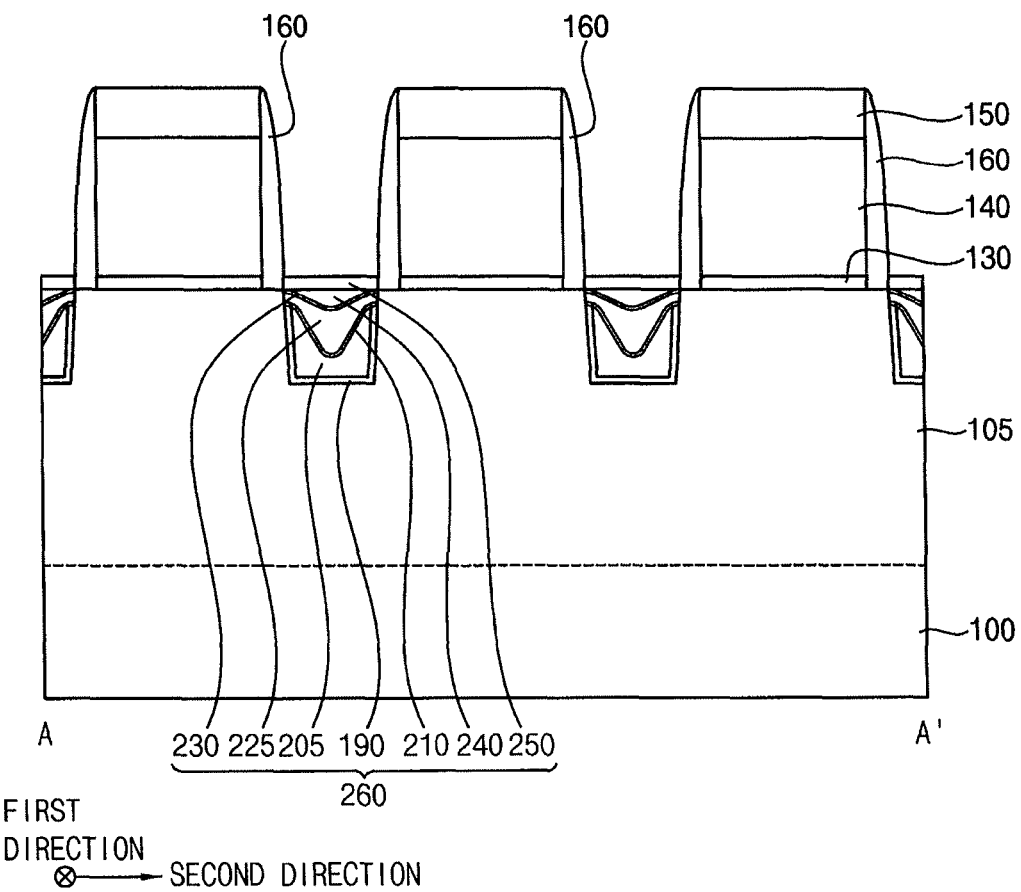
Figure 23:
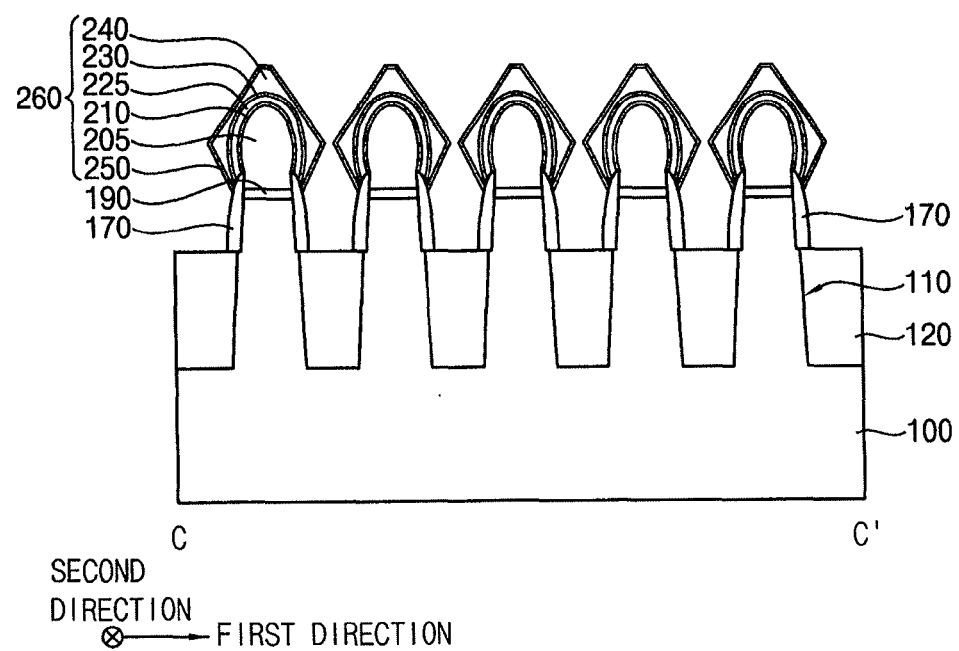
Figure 24:
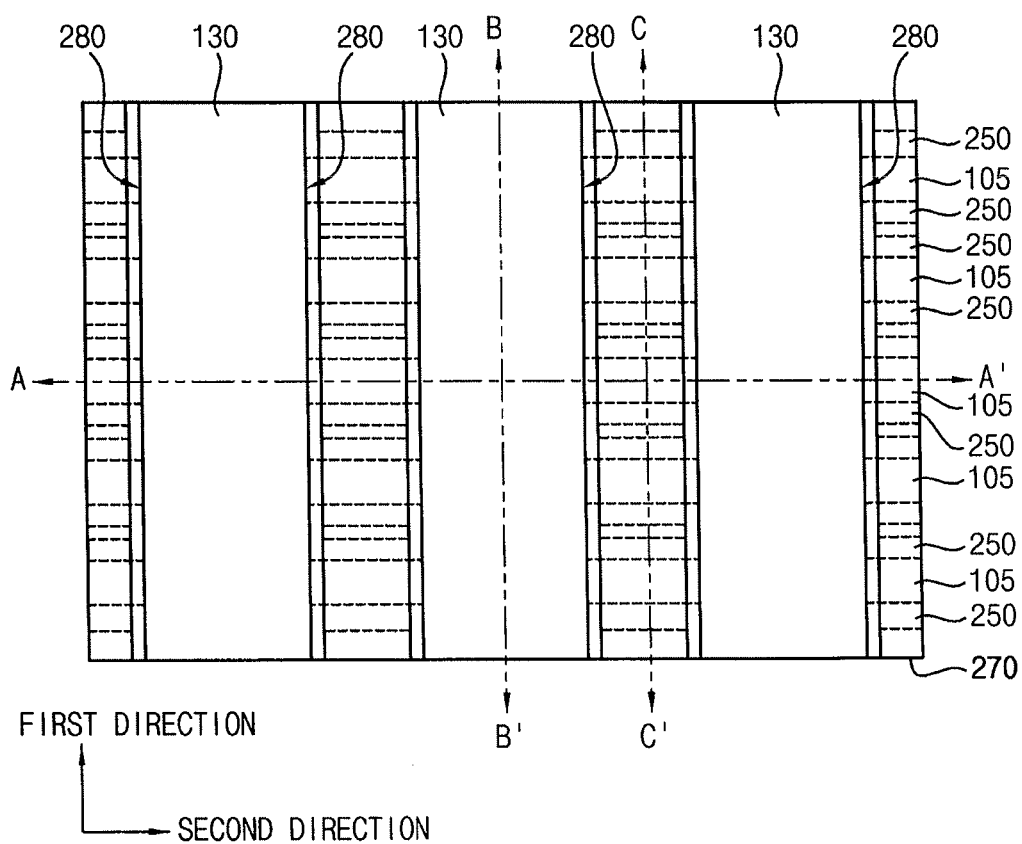
Figure 25:
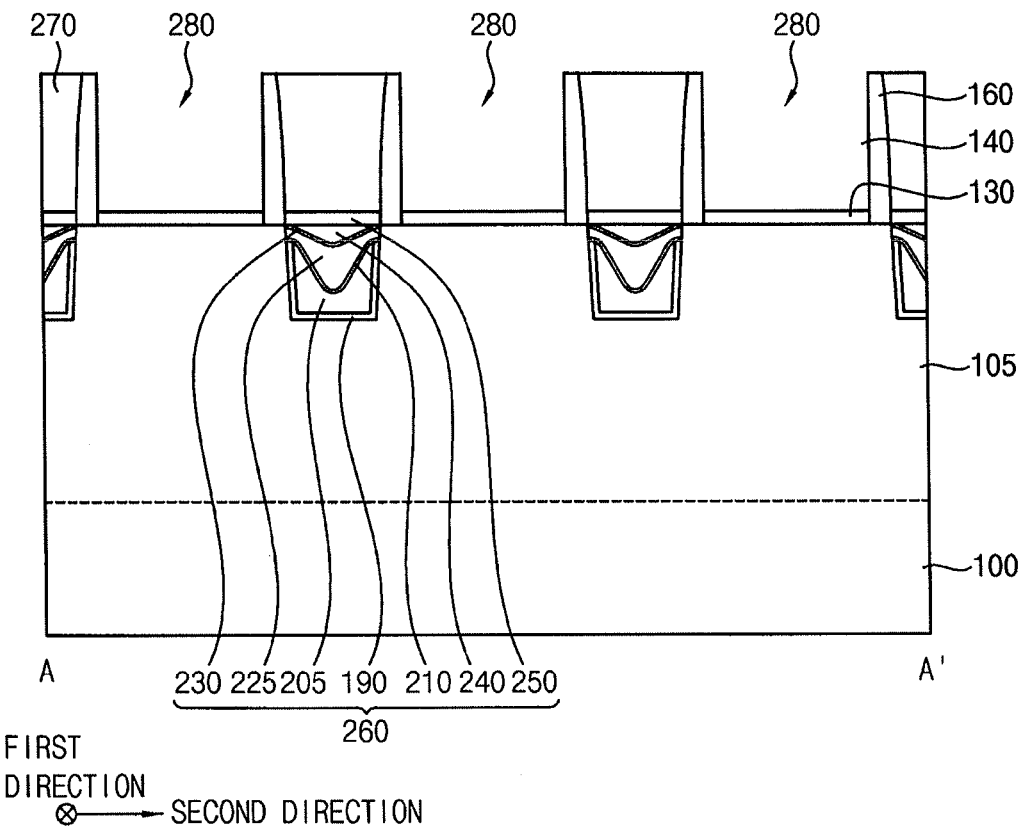
Figure 26:
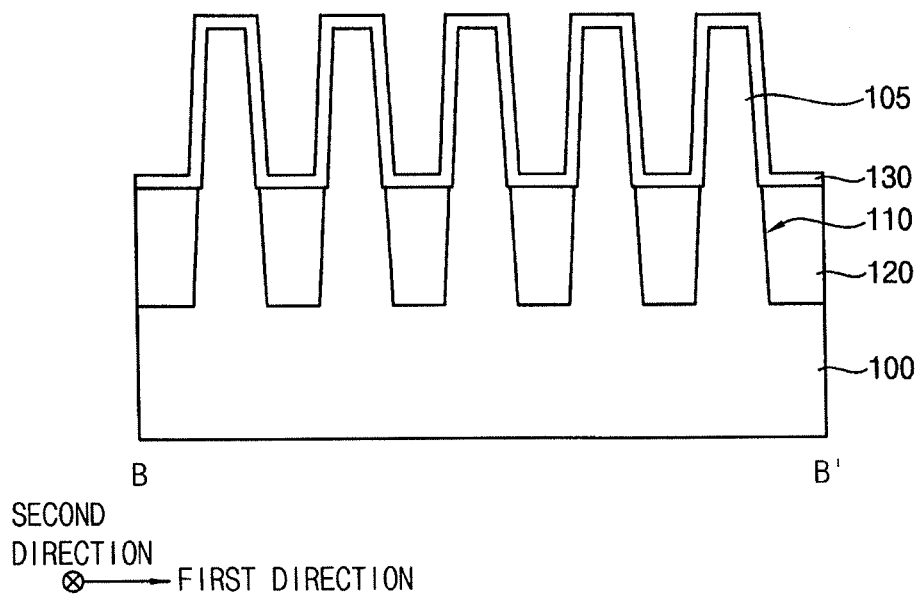
Figure 27:
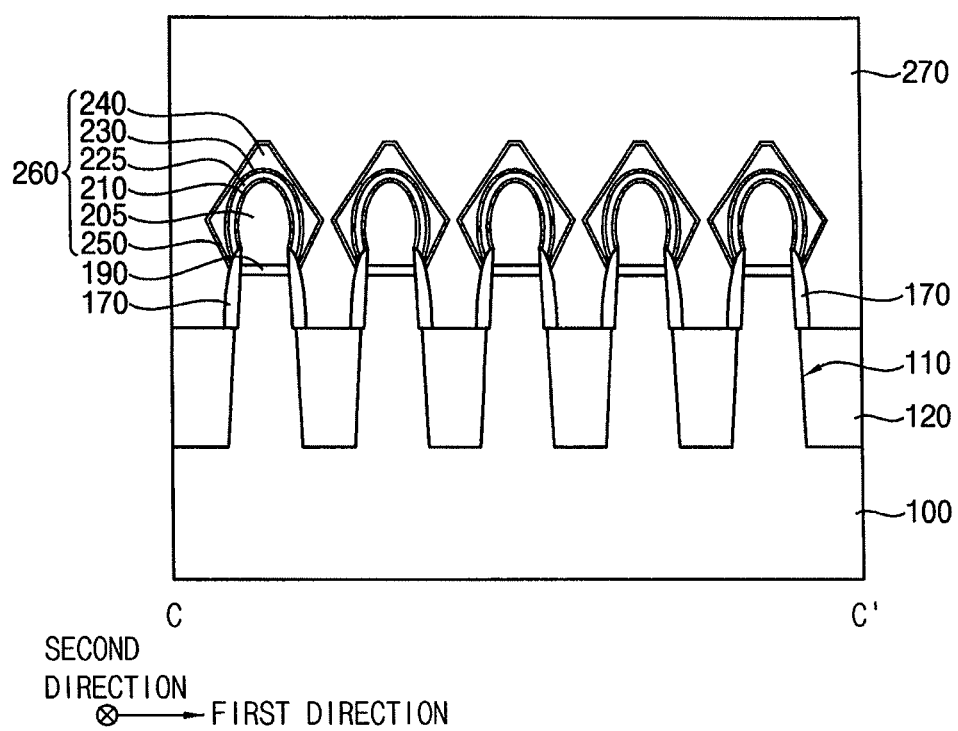
Figure 28:
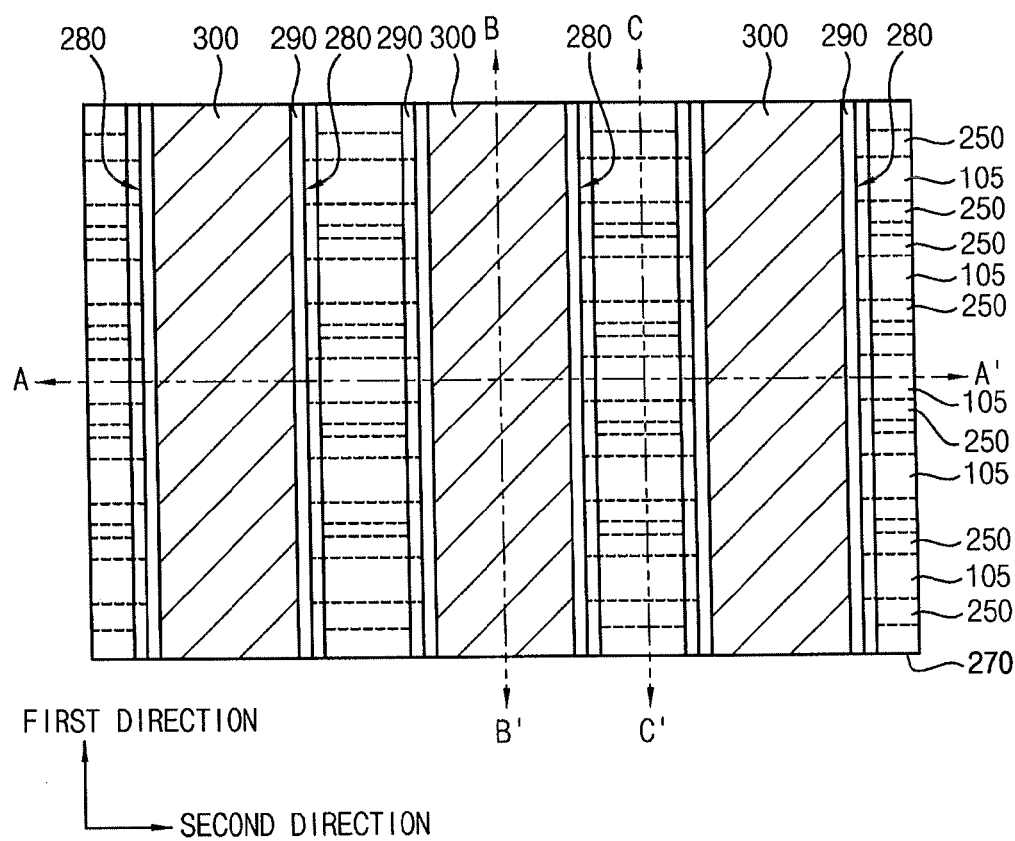
Figure 29:
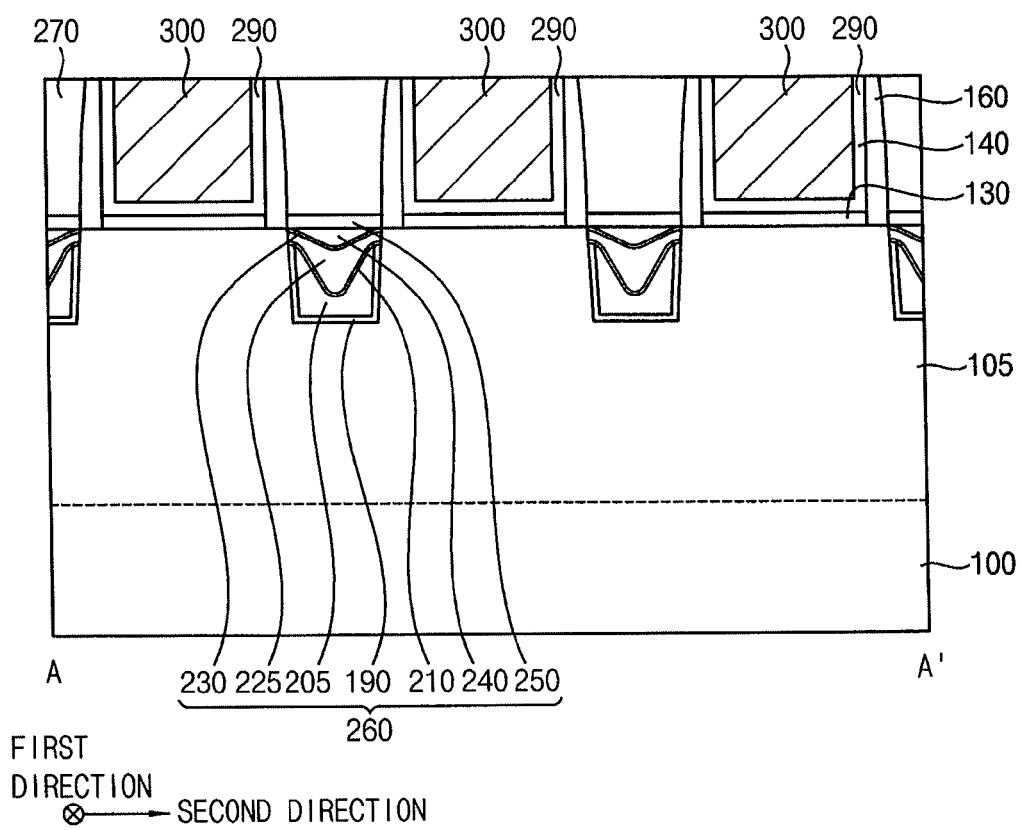
Figure 30:
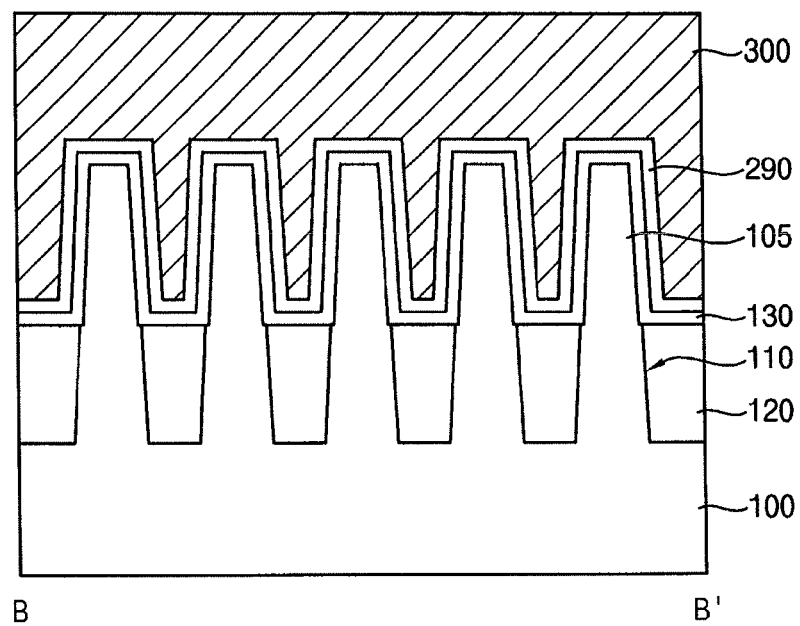
Figure 31:
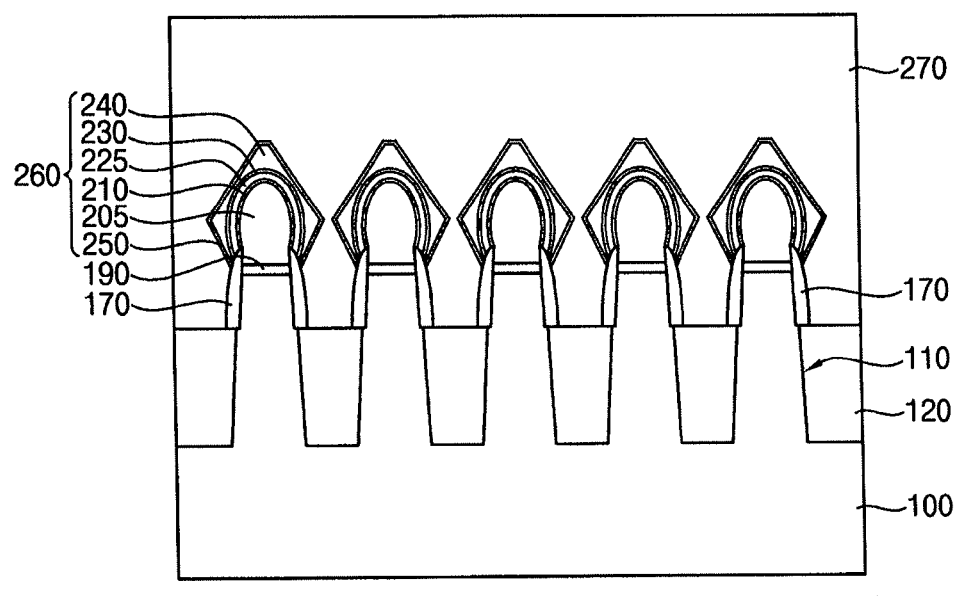

Referring to FIGS. 21 to 23, a fourth SEG process substantially the same as or similar to that illustrated with reference to FIGS. 17 and 18 may be performed.

A fourth silicon-germanium layer 240 may be formed on the second silicon-rich silicon-germanium layer 230. The fourth silicon-germanium layer 240 may have a cross-section cut along the first direction in a shape of a pentagon or hexagon. The fourth silicon-germanium layer 240 may sufficiently fill the second trench 180, and an upper surface of a cross-section cut along the second direction of the fourth silicon-germanium layer 240 may be flat.

The fourth silicon-germanium layer 240 formed by the fourth SEG process may not completely fill the second trench, and a purge process and/or a SEG process may be performed at least once more. The purge process and/or the SEG process may be performed until the second trench 180 may be sufficiently filled by the SEG process.

A fifth SEG process may be performed to form a silicon layer 250 on the fourth silicon-germanium layer 240.

The fifth SEG may be performed, no germanium source gas may be provided into the chamber, and the silicon layer 250 may be formed on the fourth silicon-germanium layer 240. In example embodiments, the silicon layer 250 may be conformally formed on the fourth silicon-germanium layer 240, and may have a cross-section cut along the first direction in a shape of a pentagon or hexagon. An upper surface of a cross-section cut along the second direction of the silicon layer 250 may be flat.

The silicon layer 250 may not include germanium, an insulating interlayer 270 (refer to FIGS. 24 to 27) may be subsequently formed to cover the silicon layer 250 and etched to form a contact hole (not shown) exposing the silicon layer 250, and the silicon layer 250 may not be etched quickly.

The first silicon-germanium layer 190, the second silicon-germanium layer pattern 205, the first silicon-rich silicon-germanium layer 210, the third silicon-germanium layer 225, the second silicon-rich silicon-germanium layer 230, the fourth silicon-germanium layer 240 and the silicon layer 250 may serve as a source/drain region of a positive-channel metal oxide semiconductor (PMOS) transistor, and those may be defined as a source/drain layer 160 as a whole.

Referring to FIGS. 24 to 27, the insulating interlayer 27 covering the dummy gate structures, the gate spacer 160, the source/drain layer 260, the spacer 170 and the isolation layer 120 may be formed to a sufficient height on the substrate 100, and the insulating interlayer 270 may be planarized until top surfaces of the dummy gate electrodes 140 may be exposed. During the planarization process, gate masks 150 of the dummy gate structures and an upper portion of the gate spacer 160 may be also removed. In example embodiments, the planarization process may be performed by a chemical mechanical polishing (CMP) process and/or an etching process.

The exposed dummy gate electrodes 140 may be removed to form openings 280 exposing top surfaces of the gate insulation layer patterns 120, respectively.

In example embodiments, a dry etch process and a wet etch process may be performed, and the dummy gate electrodes 140 may be sufficiently removed. The wet etch process may be performed using HF as an etching solution.

Referring to FIGS. 28 to 31, a high-k dielectric layer pattern 290 and a gate electrode 300 may be formed to fill each of the openings 280.

A high-k dielectric layer may be formed on the exposed top surfaces of the gate insulation layer patterns 130, sidewalls of the openings 280 and a top surface of the insulating interlayer 270, and a gate electrode layer may be formed on the high-k dielectric layer to sufficiently fill remaining portions of the openings 280.

The high-k dielectric layer may be formed to include a metal oxide having a high dielectric constant, e.g., hafnium oxide, tantalum oxide, or zirconium oxide. The gate electrode layer may be formed to include a material having a low resistance, e.g., a metal such as aluminum, copper, or tantalum, or a metal nitride thereof by, for example, an ALD process or a physical vapor deposition (PVD) process. In an example embodiment, a heat treatment process, e.g., a rapid thermal annealing (RTA) process, a spike rapid thermal annealing (spike RTA) process, a flash rapid thermal annealing (flash RTA) process or a laser annealing process may be further performed. In an embodiment, the gate electrode layer may be formed to include doped polysilicon.

The gate electrode layer and the high-k dielectric layer may be planarized until the top surface of the insulating interlayer 270 may be exposed to form the high-k dielectric layer pattern 290 on the top surface of the gate insulation layer pattern 130 and the sidewall of each of the openings 280, and the gate electrode 300 filling a remaining portion of each of the openings 280 on the high-k dielectric layer pattern 290. A bottom and a sidewall of the gate electrode 300 may be covered by the high-k dielectric layer pattern 290. In example embodiments, the planarization process may be performed by a CMP process and/or an etch back process.

The gate insulation layer pattern 130, the high-k dielectric layer pattern 290 and the gate electrode 300 sequentially stacked may form a gate structure, and the gate structure and the source/drain layer 260 may form the PMOS transistor.

An insulating interlayer (not shown) covering the PMOS transistor may be formed, and a contact plug (not shown) may be further formed through the insulating interlayer to be electrically connected to the source/drain layer 260 or the gate structure.

As illustrated above, in the method of manufacturing the semiconductor device, an upper portion of the active fin 105 not covered by the dummy gate structure may be removed, and a SEG process may be performed using a top surface of the active fin 105 exposed by the second trench 180 as a seed to form a silicon-germanium layer. Hydrogen ($H_2$) gas may be provided to perform a purge process, and the silicon-germanium layer may be partially removed in the purge process. The SEG process and the purge process may be repeatedly performed to form a silicon-germanium layer sufficiently filling the second trench 180.

The semiconductor device formed by the above-illustrated processes may include the substrate 100 having the active fin 105 extending in the second direction, the plurality of gate structures extending in the first direction on the active fin 105, and the source/drain layer 260 filling the second trench 180 on the active fin 105 between the gate structures 310 and having a cross-section cut along the first direction in a shape of a pentagon or hexagon. The cross-section cut along the first direction of the source/drain layer 260 may include a band therein, which may have a shape of a portion of an elliptical ring or a portion of a circular ring.

The above semiconductor device and the method of manufacturing the semiconductor device may be applied to various types of memory devices including a finFET and a source/drain layer formed by a SEG process. For example, the semiconductor device and the method of manufacturing the same may be applied to logic devices such as, for example, central processing units (CPUs), microprocessor units (MPUs), or application processors (APs). Additionally, the semiconductor device and the method of manufacturing the same may be applied to volatile memory devices such as, for example, DRAM (dynamic random-access memory) devices or SRAM (static random-access memory) devices, or non-volatile memory devices such as, for example, flash memory devices, PRAM (phase-change random access memory) devices, MRAM (magnetoresistive random access memory) devices, or RRAM (resistive random access memory) devices.

By way of summation and review, when a PMOS finFET is formed, gate structures may be formed on an active fin, a trench may be formed on a portion of the active fin not covered by the gate structures, and a silicon-germanium layer, e.g., a source/drain layer, may be formed by a SEG process to fill the trench. The gate structures may be formed with a large distance therebetween, a facet may be formed in accordance with the direction of growth of the silicon-germanium layer, the silicon-germanium layer may be formed to have a V-like shape, and the trench may not be completely filled. A contact plug subsequently formed on the silicon-germanium layer may not properly contact the silicon-germanium layer.

In example embodiments, a SEG process in which growing steps and etching steps are alternately and repeatedly performed may be produced, facet defect formation may be reduced, and a silicon-germanium layer completely filling the trench may be formed. In the growing step, a silicon source gas, a germanium source gas, an impurity source gas, hydrogen chloride (HCl) gas serving as an etching gas, and hydrogen ($H_2$) gas serving as a carrier gas may be provided into a chamber to form a silicon-germanium layer, and in the etching step, the hydrogen ($H_2$) gas may be provided to purge the chamber, and the etching gas having a relatively high molecular weight may remain in the chamber to etch the silicon-germanium layer.

Example embodiments provide a semiconductor device having good characteristics, and a method of manufacturing a semiconductor device having good characteristics. In a method of manufacturing a semiconductor device in accordance with example embodiments, an upper portion of an active fin not covered by a dummy gate structure may be removed, and a SEG process may be performed using a top surface of the active fin exposed by a trench as a seed to form a silicon-germanium layer. Hydrogen ($H_2$) gas may be provided to perform a purge process, and the silicon-germanium layer may be partially removed in the purge process. The SEG process and the purge process may be repeatedly performed, and a silicon-germanium layer sufficiently filling the trench may be easily formed.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    partially removing an upper portion of an active fin of a substrate loaded in a chamber to form a trench; and
    forming a source/drain layer in the trench, including:
        providing a silicon source gas, a germanium source gas, an etching gas and a carrier gas into the chamber to perform a selective epitaxial growth (SEG) process using a top surface of the active fin exposed by the trench as a seed so that a silicon-germanium layer is grown; and
        purging the chamber by providing the carrier gas into the chamber to etch the silicon-germanium layer.

2. The method as claimed in claim 1, wherein the silicon source gas includes dichlorosilane ($SiH_2Cl_2$) gas, the germanium source gas includes germane ($GeH_4$) gas, the etching gas includes hydrogen chloride (HCl) gas, and the carrier gas includes hydrogen ($H_2$) gas.

3. The method as claimed in claim 2, wherein a ratio of the etching gas with respect to the germanium source gas remaining in the chamber during at least an initial period of etching the silicon-germanium layer is higher than that during growing the silicon-germanium layer.

4. The method as claimed in claim 2, wherein growing the silicon-germanium layer is performed by providing diborane ($B_2H_6$) gas serving as a p-type impurity source gas into the chamber in addition to the silicon source gas, the germanium source gas, the etching gas and the carrier gas.

5. The method as claimed in claim 1, wherein forming the source/drain layer includes:
    forming a first silicon-germanium layer;

forming a second silicon-germanium layer on the first silicon-germanium layer, the second silicon-germanium layer having higher contents of germanium and boron than the first silicon-germanium layer; and forming a silicon layer on the second silicon-germanium layer, wherein forming the second silicon-germanium layer includes growing the second silicon-germanium layer and etching the second silicon-germanium layer.

6. The method as claimed in claim 1, wherein growing the silicon-germanium layer and etching the silicon-germanium layer are each performed a plurality of times.

7. The method as claimed in claim 6, wherein the trench is filled with the silicon-germanium layer after growing the silicon-germanium layer a plurality of times.

8. The method as claimed in claim 1, wherein etching the silicon-germanium layer is performed at a temperature higher than that of growing the silicon-germanium layer.

9. The method as claimed in claim 1, further comprising forming a plurality of dummy gate structures on the active fin prior to forming the trench, wherein the trench is formed by removing an upper portion of the active fin not covered by the dummy gate structures.

* * * * *